United States Patent [19]

Altendorf et al.

[11] Patent Number: 5,092,034
[45] Date of Patent: Mar. 3, 1992

[54] SOLDERING INTERCONNECT METHOD FOR SEMICONDUCTOR PACKAGES

[75] Inventors: John M. Altendorf; Marvin G. Wong, both of Corvallis, Oreg.

[73] Assignee: Hewlett-Packard Company, Palo Alto, Calif.

[21] Appl. No.: 544,770

[22] Filed: Jun. 27, 1990

Related U.S. Application Data

[62] Division of Ser. No. 285,988, Dec. 19, 1988, Pat. No. 5,005,070.

[51] Int. Cl.⁵ .............................................. H05K 3/34
[52] U.S. Cl. ........................................ 29/840; 29/827; 174/52.4; 357/74
[58] Field of Search .................. 29/827, 840; 357/74; 174/52.4

[56] References Cited

U.S. PATENT DOCUMENTS

| | | | |
|---|---|---|---|
| 4,079,511 | 3/1978 | Grabbe | 29/827 |
| 4,147,889 | 4/1979 | Andrews et al. | 174/52.4 |
| 4,155,615 | 5/1979 | Zimmerman, Jr. et al. | 29/827 X |
| 4,482,781 | 11/1984 | Burns | 174/52.4 |
| 4,641,176 | 2/1987 | Keryhuel et al. | 357/74 |
| 4,706,811 | 11/1987 | Jung et al. | 174/52.4 X |
| 4,736,520 | 4/1988 | Morris | 29/827 |
| 4,746,392 | 5/1988 | Hoppe | 29/827 X |
| 4,827,376 | 5/1989 | Voss | 29/827 X |
| 4,873,615 | 10/1989 | Grabbe | 174/52.4 X |
| 4,953,173 | 8/1990 | Fujitsu | 174/52.4 X |

OTHER PUBLICATIONS

IBM Tech. Disclosure Bulletin, vol. 29, No. 6, Nov. 1986, pp. 2486–2487.

Primary Examiner—Carl J. Arbes

[57] ABSTRACT

A method and apparatus for attaching the outer leads of a semiconductor package (preferably a Tape Automated Bonded circuit) to the traces on a printed circuit board is described. The outer leads of the package are configured in an angled orientation so that the tip of each lead extends downwardly below the lower surface of the package. As a result, placement of the package against the circuit board causes the leads to be biased downwardly against the traces. In order to accomplish this, the package is secured to the board using a rigid frame structure. The frame structure urges the edges of the package against the board. This insures that the leads make electrical contact with the traces in a fast and efficient manner, while avoiding problems associated with a lack of lead coplanarity.

17 Claims, 2 Drawing Sheets

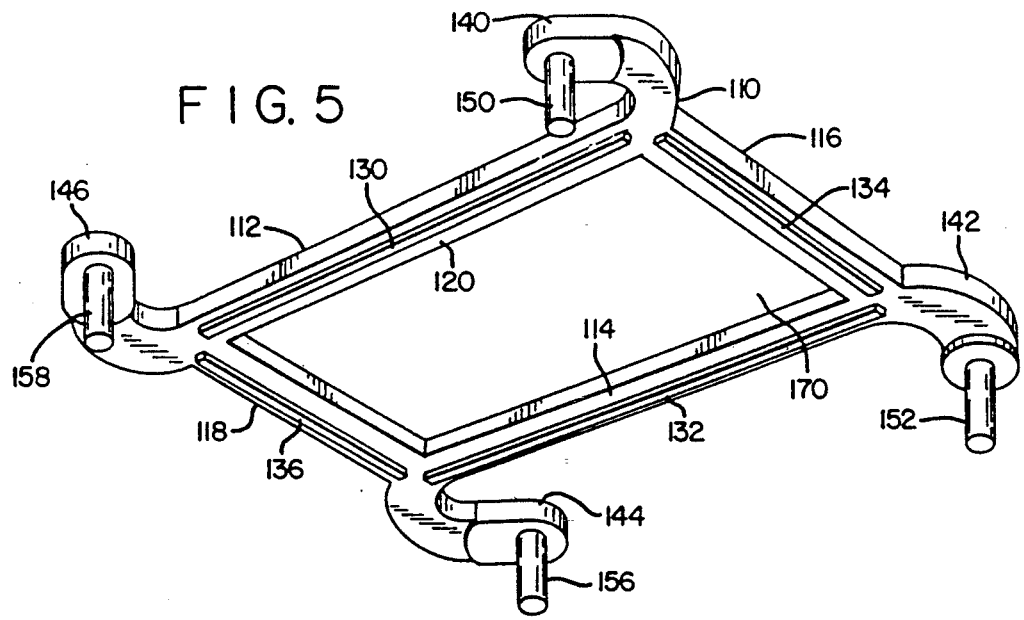
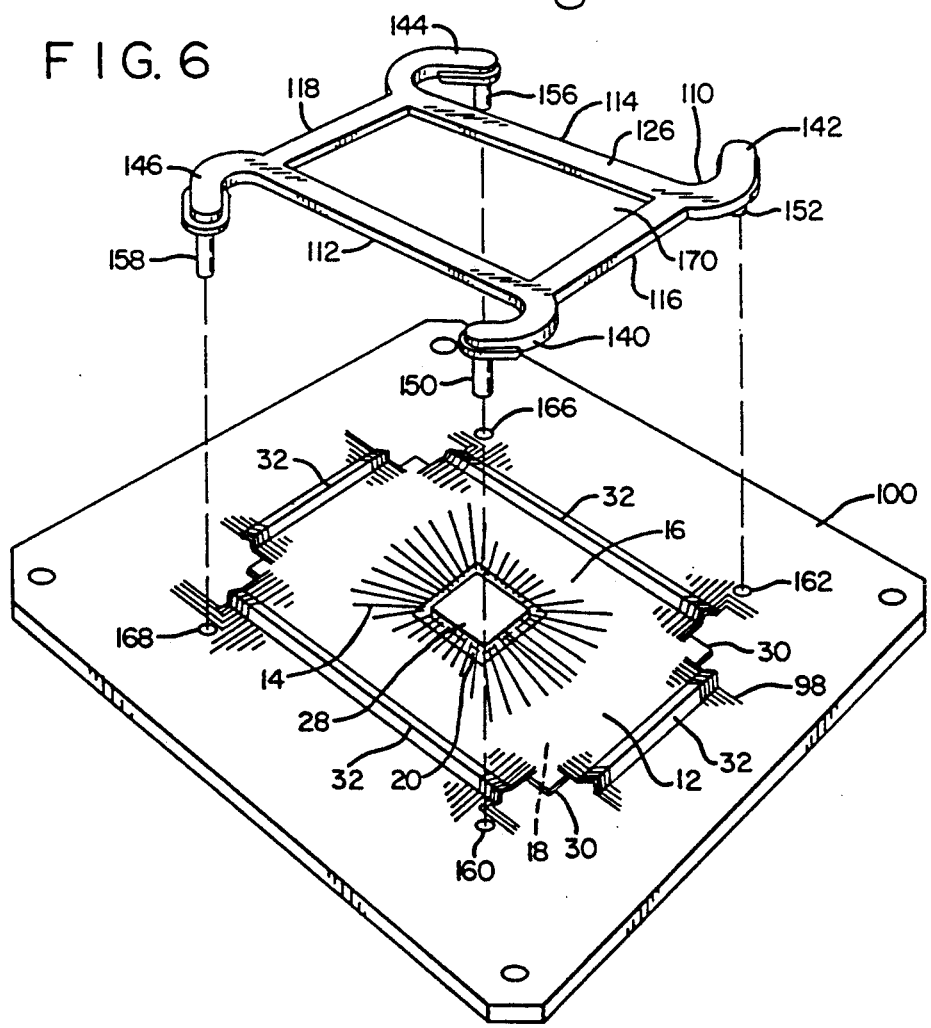

SOLDERING INTERCONNECT METHOD FOR SEMICONDUCTOR PACKAGES

CROSS REFERENCE TO RELATED APPLICATION

This is a division of application Ser. No. 07/285,988, filed Dec. 19, 1988 now U.S. Pat. No. 5,005,070 issued April 1991.

BACKGROUND OF THE INVENTION

The present invention generally relates to a soldering interconnect method and apparatus for semiconductor units, and more particularly to a soldering interconnect system designed to secure multi-lead semiconductor packages to traces on a printed circuit board in a highly rapid and efficient manner.

Recent advances in microelectronic technology have resulted in the development of new, powerful, and compact integrated circuit packages. These packages typically incorporate a plurality of outer conductive leads designed for electrical attachment by soldering to an appropriate substrate (e.g. a printed circuit board). Attachment of the outer leads to the conductive traces on a printed circuit board requires special techniques to insure a high degree of accuracy and production efficiency. One type of circuit for which these considerations are especially important is a Tape Automated Bonded circuit package (hereinafter referred to as a "TAB" circuit).

TAB circuits were first researched and developed in the mid-1960's. As discussed in Rima, P. W., "The Basics of Tape Automated Bonding", *Hybrid Circuit Technology*, November, 1984, pps. 15–21, a TAB circuit is constructed using a thin film carrier tape which is typically stored on large reels. The tape has a variable width of between 8 and 70 mm, and is approximately 5 mils thick. The length of each portion of tape used to form an individual circuit package is selectively variable, depending on the type of circuit to be made. The tape may be manufactured from a variety of different dielectric materials including polyimide, polyester, and/or epoxy-glass compositions. Polyimide is preferred in that it has a high degree of mechanical strength, is capable of withstanding relatively high temperatures, and has a coefficient of linear expansion similar to that of copper. It also has a relatively low coefficient of moisture absorption (about 3%).

To construct the TAB circuit, an opening or "window" is punched through the center of each portion or "frame" of tape. Thereafter, a thin, conductive foil preferably manufactured of copper or copper alloy is bonded to the tape using an adhesive known in the art. The foil is approximately 1.4 mils thick, and is subsequently etched to produce a conductive printed circuit pattern having beam-type inner lads which extend into the window. The conductive printed circuit pattern terminates at the outer edges of the frame in a plurality of resilient beam-type outer leads which extend beyond the edges of the frame.

In an alternative construction method, the copper/copper alloy materials used to produce the circuit pattern may be directly sputtered or plated onto the tape. Thereafter, both the copper materials and polyimide are etched to the desired configuration. Next, an integrated circuit chip of selectively variable design and complexity is then positioned within the window and secured therein by bonding the inner leads to contact pads on the chip. This process (known as "inner-lead bonding") usually involves high speed soldering or thermocompression techniques known in the art. The resulting product consists of a thin-film panel with a conductive circuit pattern thereon having a center-mounted integrated circuit device. The entire unit is then positioned on a printed circuit board in order to secure the outer leads to conductive traces on the board in a process known as "outer lead bonding". At this stage in the fabrication process, great care must be taken in securing the outer leads of the TAB circuit to the printed circuit board. The large number of outer leads used in most TAB circuits combined with their small size and close spacing renders the outer lead bonding process difficult, time-consuming and subject to numerous inaccuracies.

The present invention involves an improved method and apparatus for bonding the outer leads of TAB circuits and other packaged semiconductor devices to conductive traces on a printed circuit board. The method and apparatus described herein is characterized by a high degree of accuracy, efficiency, and effectiveness. Accordingly, the present invention represents an advance in the art of soldering interconnect technology, as described in detail herein.

SUMMARY OF THE INVENTION

It is an object of the present invention to provide an improved method and apparatus for securing the outer leads of a semiconductor package to a substrate.

It is another object of the invention to provide an improved method and apparatus for securing the outer leads of a semiconductor package to a substrate which is especially useful in mounting TAB circuits to printed circuit boards.

It is another object of the invention to provide an improved method and apparatus for securing the outer leads of a semiconductor package to a substrate which enables rapid and accurate attachment of the leads using minimal amounts of equipment and soldering materials.

It is another object of the invention to provide an improved method and apparatus for securing the outer leads of a semiconductor package to a substrate which reduces the amount of time necessary to attach the leads in comparison with conventional methods.

It is an even further object of the invention to provide an improved method and apparatus for securing the outer leads of a semiconductor package to a substrate which uses conventional solder compositions and heating methods.

It is a still further object of the invention to provide an improved method and apparatus for securing the outer leads of a semiconductor package to a substrate which minimizes problems associated with a lack of outer lead coplanarity.

In accordance with the foregoing objectives, a method and apparatus is provided for attaching the outer less of a packaged semiconductor device to a substrate. The techniques and materials of the invention are especially useful in securing the outer leads of a TAB circuit to traces on a printed circuit board having solder materials thereon. As described herein, the outer leads of a selected semiconductor package are first configured in an angled orientation so that the tip of each lead extends below the lower surface of the package. As a result, placement of the package against the circuit board causes the outer leads to be biased downward against the traces on the board. To accomplish this, the package must be firmly secured to the circuit board, which is preferably done using a rigid frame structure. The frame structure is designed to urge the edges of the package against the board. This enables the outer leads of the package to be firmly pressed against the traces with a substantially equal degree of pressure Using this method, the outer leads make electrical contact in a fast and efficient manner, while avoiding problems associated with a lack of lead coplanarity inherent in previously-used methods.

These and other objects, features, and advantages of the invention shall be described below in the following brief description of the drawings and detailed description of a preferred embodiment.

BRIEF DESCRIPTION OF THE DRAWINGS

FIG. 5 is a bottom perspective view of a frame structure used to secure the circuit package of FIG. 1 to a printed circuit board so that outer lead bonding is facilitated; and FIG. 6 is a top, partially exploded perspective view of a circuit board having the circuit package of FIG. 1 thereon which is urged downwardly using the frame structure of FIG. 5.

DETAILED DESCRIPTION OF A PREFERRED EMBODIMENT

The present invention represents an improved method and apparatus for attaching the outer leads of a semiconductor package to electrically conductive traces on a substrate. The method and apparatus described herein enables the outer lead bonding process to be accomplished in a fast, efficient, and more accurate manner in comparison with previously-used techniques.

While the present invention will primarily be discussed with reference to a TAB (Tape Automated Bonded) integrated circuit, it is equally applicable to any semiconductor package which includes a plurality of substantially planar, outwardly extending leads designed for attachment to a substrate (e.g., a printed circuit board). For example, the methods and materials described below may be used in connection with a variety of integrated circuit packaging types, including conventional plastic DIP (dual-in-line) units, ceramic packages (CERDIP units), and flex circuits known in the art. Thus, reference to the use of TAB circuitry herein shall not be considered as limiting.

Figure 1:
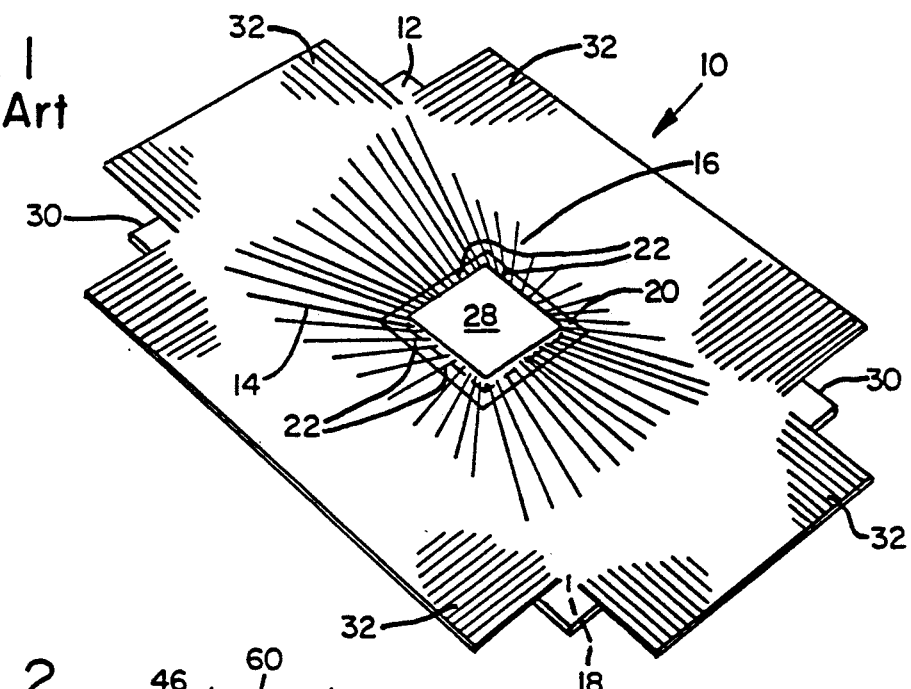
FIG. 1 is a perspective view of a typical tape automated bonded (TAB) integrated circuit package usable in conjunction with the method and apparatus of the present invention.

With reference to FIG. 1, a conventional TAB circuit package 10 is illustrated. The TAB circuit package 10 includes a dielectric film portion 12 (preferably polyimide) having a metallized conductive pattern 14 thereon preferably manufactured of copper or copper alloy. The pattern is prepared using conventional photoresist techniques. The circuit package 10 has an upper surface 16 (which comprises the conductive pattern and a lower surface 18. Positioned in the center of the film portion 12 is a window 20. A plurality of conductive inner leads 22 extend into the window 20 (FIG. 1). The inner leads 22 are preferably formed as an integral part of the conductive pattern 14. The inner leads 22 are ultimately bonded to appropriate contact regions (not shown) on an integrated circuit chip 28 of selectively variable design which is positioned within the window 20. Bonding of the inner leads 22 to the chip 28 is accomplished using known procedures, including high-speed soldering or thermocompression techniques.

The conductive pattern 14 terminates at the peripheral edges 30 of the film portion 12 in a plurality of resilient outer leads 32 which are planar, parallel to each other, and of substantially equivalent length. The outer leads 32 extend beyond the peripheral edges 30 of the film portion 12, as shown in FIG. 1. In a preferred embodiment, each outer lead 32 is approximately 0.0014 inch thick, 0.01 inch wide, and extends beyond the peripheral edges 30 of the film portion 12 by approximately 0.083 inch. In addition, the distance from the center line of one outer lead 32 to the center line of an adjacent outer lead 32 is approximately 0.02 inch (preferred). However, these dimensions may vary in accordance with the specific type of circuit involved.

The outer leads 32 must be properly configured in order to effectively communicate with the conductive traces on a conventional printed circuit board. The traces are normally pre-deposited with solder pastes using standard screen-printing techniques. By definition, solder pastes normally consist of a plurality of metallic spheres immersed in a flux composition. A preferred solder paste as described herein consists of a eutectic formulation comprising about 63% tin and about 37% lead which is manufactured by Alpha Metals, Inc. While the present invention will be discussed with reference to solder pastes, an alternative embodiment would involve the application of solder to traces on a printed circuit board using standard plating methods.

In view of the small size and close spacing of the outer leads 32, care must be taken to insure that the leads 32 make sufficient contact with the traces on the circuit board. This is typically accomplished by physically deforming each of the outer leads 32 in a desired configuration.

Figure 2:
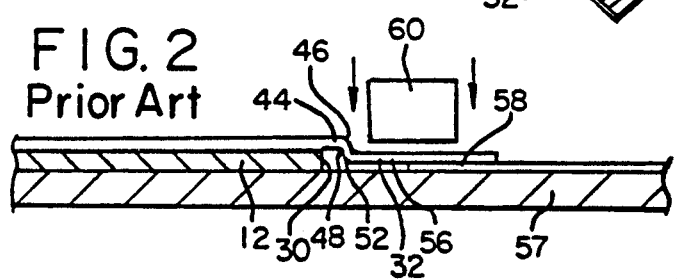
FIG. 2 is a side view of an outer lead of the circuit package of FIG. 1 which is formed in accordance with prior art techniques.

With reference to FIG. 2, a previously-used technique for deforming the outer leads 32 and securing them in position is shown. In FIG. 2, a resilient outer lead 32 extends laterally outward from the film portion 12 of the TAB circuit of FIG. 1. The outer lead 32 includes a first horizontal section 44 which extends beyond the peripheral edge 30 of the film portion 12 and terminates at position 46. Extending downwardly at approximately a 90 degree angle from position 46 of section 44 is a vertical section 48 which terminates at position 52. Extending laterally outward from position 52 at about a 90 degree angle is a second horizontal section 56. After attachment of the film portion 12 to an appropriate circuit board 57, the second horizontal section 56 of each lead 32 is urged downwardly against a trace 58 on the circuit board 57 using a heated elongate member 60 known as a "hot bar". The member 60 is sufficiently long to be urged against all of the outer leads 32 along the peripheral edge 30 of the film portion 12 in a simultaneous manner. As the member 60 pushes downwardly on the second horizontal section 56 of each outer lead 32, heat from the member 60 causes solder (not shown) deposited on the trace 58 to be liquified, thereby permitting attachment of the outer lead 32 to the trace 58.

Nonetheless, there are many problems associated with the procedure of FIG. 2. First, proper bonding of some or all of the outer leads 32 will not occur if the second horizontal sections 56 of the leads 32 are not coplanar. If some of the sections 56 are positioned above others, they will not make contact with the traces 58 on the circuit board 57 when the hot bar simultaneously urges the outer leads 32 downward. More specifically, differences in outer lead height above a circuit board of as little as 0.001 inch can cause problems in the method of FIG. 2. To correct this problem, the hot bar must be urged downward with a substantial amount of force. However, if solder pastes are used, this frequently results in spreading of the pastes from one trace to another, thereby causing undesired communication between traces (more commonly known as "bridging").

Figure 3:
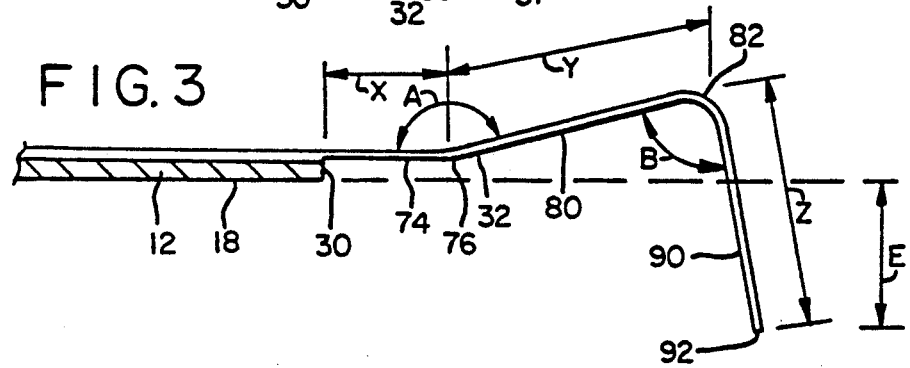
FIG. 3 is a side view of an outer lead of the circuit package of FIG. 1 which is formed in accordance with the present invention.

In order to avoid these problems, FIG. 3 shows another resilient outer lead 32 secured to the TAB circuit film portion 12 of FIG. 1 which is configured in accordance with the present invention. The outer lead 32 is approximately 0.0014 inch thick, 0.01 inch wide, and made of resilient copper or copper alloy. The distance from the centerline of each outer lead 32 to the centerline of an adjacent lead 32 is about 0.02 inch.

With continued reference to FIG. 3, the outer lead 32 includes a first section 74 which terminates at position 76 and extends beyond the peripheral edge 30 of the film portion 12. In a preferred embodiment, the section 74 has a length "X" of approximately 0.019 inch (±0.003 inch). Thereafter, the outer lead 32 includes an upwardly angled second section 80 beginning at position 76 having a preferred length "Y" of about 0.035 inch (±0.003 inch). The section 80 terminates at position 82, and forms an angle "A" of approximately 163°-170° relative to section 74. Beginning at position 82, a third downwardly angled section 90 is provided having a preferred length "Z" of approximately 0.032 inch (±0.002 inch). The third section 90 forms an angle "B" of approximately 85°-95° relative to section 80.

In the configuration described above which is accomplished using a standard forming die system known in the semiconductor art, the end or tip 92 of the third section 90 is positioned below the lower surface 18 of the film portion 12. In a preferred embodiment, this distance "E" (FIG. 3) is about 0.019 inch. However, this dimension may be suitably varied within the scope of the invention as long as the tip 92 is positioned below the lower surface 18 of the film portion 12. Placement of the tip 92 in this position is important in that it enables the tip 92 to be spring-biased against a selected trace 98 on a printed circuit board 100 (FIG. 4) when the film portion 12 is urged against the board 100. Biasing of the tip 92 against the trace 98 enables the tip 92 to accurately penetrate solder pastes 99 on the trace 98 without the exertion of undue force. This prevents solder bridging between adjacent traces, as described above. Also, spring-biasing of the leads enables them to be urged downward independently of each other, thereby eliminating problems associated with a lack of lead coplanarity.

As previously described, it is important that the tip 92 of each outer lead 32 be positioned below the lower surface 18 of the film portion 12. While the lead angles and lengths presented herein may be suitably varied within the scope of the invention, the distance "E" between the tip 92 and the lower surface 18 of the film portion 12 should be equal to or greater than the elastic limit distance of the outer lead 32. The term "elastic limit distance" as used herein shall involve the minimum distance that tip 92 will travel back downward after an upward force is applied thereto, even if the outer lead 32 is permanently deformed. For example, in the embodiment of FIGS. 3 and 4, when the tip 92 is urged upward by approximately 0.01 inch, it will resiliently move downward by the same distance. This is considered to be the "elastic limit distance" of the outer lead 32. If the tip 92 is urged upward beyond 0.01 inch, it will be permanently deformed although it will still move downward after deformation by the elastic limit distance of 0.01 inch. For example, if the tip 92 is moved upward by approximately 0.03 inch it will still move back downward by 0.01 inch even though it is permanently deformed upward from its original position by 0.02 inch.

It is important that the tip 92 be positioned beneath the lower surface 18 of the film portion 12 by a distance "E" equal to or exceeding that of the elastic limit distance so that the tip 92 will always be biased downwardly against a selected trace on the circuit board when the film portion 12 is secured thereto. Specifically, attachment of the film portion 12 to the circuit board will cause the outer leads 32 to be pushed upward since they originally extended below the lower surface 18 of the film portion 12 (see dashed lines in FIG. 4). As a result, when the leads 32 are pushed upward, they will push back downwardly on the traces due to their resilient character. A distance "E" of less than 0.01 inch in the embodiment of FIGS. 3-4 does not take full advantage of the resilient elastic properties which each outer lead 32 is capable of exerting, and will not be urged as strongly against the traces as is possible.

The elastic limit distance for each outer lead in a semiconductor package depends on a variety of factors including the length and thickness of the outer lead, as well as the materials which are used. The elastic limit distance may be readily determined by experimentation. For example, a subject lead could be urged downwardly well beyond its point of deformation, followed by measurement of the upward travel after deformation. This distance will equal the elastic limit distance.

Figure 4:
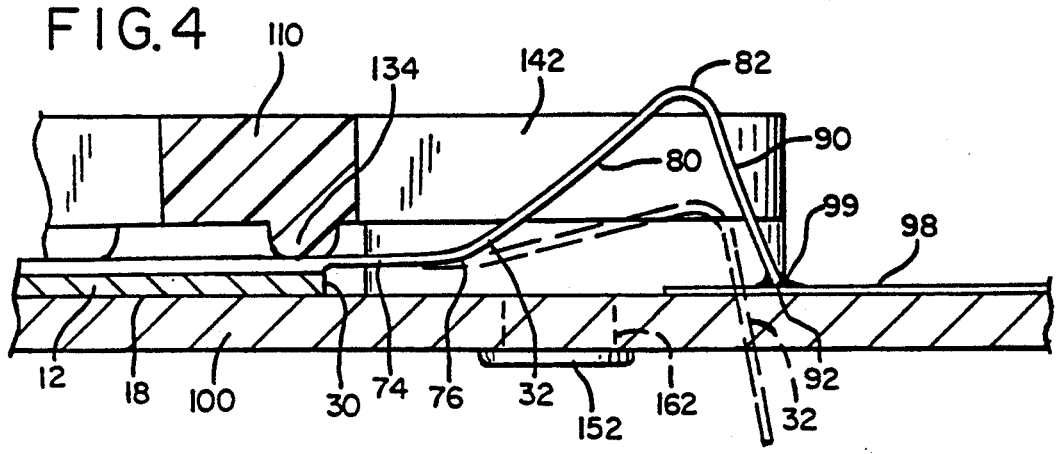
FIG. 4 is a side view of the outer lead of FIG. 3 shown secured to a trace on a printed circuit board.

In order to insure that the tip 92 is properly biased against trace 98 as shown in FIG. 4, the film portion 12 must be firmly urged against the printed circuit board 100. In a preferred form of the invention, this is accomplished using a frame structure 110 (FIGS. 4–6) having a length and width substantially equal to or slightly less than that of the film portion 12. The frame structure 110 includes parallel elongate portions 112, 114 of substantially equal length and parallel elongate portions 116, 118 of substantially equal length. As shown in FIG. 5, portions 116, 118 are shorter than portions 112, 114. The lower surface 120 of the frame structure 110 includes downwardly extending ribs 130, 132, 134, 136, the function of which will be described hereinafter. In a preferred embodiment, the upper surface 126 of the frame structure 110 is substantially planar, as shown in FIG. 6.

The frame structure 110 is preferably manufactured of a heat-resistant plastic (e.g. polyphenylene sulfide - 40% glass filled) This material is commercially available from the Phillips Chemical Company.

The frame structure 110 is designed to be secured to and against the peripheral edges 30 of the film portion 12, (FIGS. 4 and 6) thereby enabling the outer leads 32 to be urged upward so that the tips 92 may be biased downward against traces 98 on the board 100. The frame structure 110 accomplishes this since the ribs 130, 132, 134, 136 are positioned as close to the peripheral edges 30 of the film portion 12 as possible, thereby urging the edges 30 downward, which causes outer leads 32 to be pushed upward by the circuit board 100. The entire frame structure 110 is secured in position either adhesively, or using outwardly extending corner projections 140, 142, 144, 146 which include peg-like stakes 150, 152, 156, 158 extending downwardly from the lower surface 120. As shown in FIG. 6, the stakes 150, 152, 156, 158 are designed to pass through openings 160, 162, 166, 168 in the printed circuit board 100. The stakes 150, 152, 156, 158 are then thermally deformed in order to secure the frame structure 110 in position.

After attachment of the frame structure 110, soldering of the outer leads 32 to traces 98 is accomplished using a conventional vapor phase or infrared oven which melts the solder pastes or plated solder materials. Using either system, a temperature of approximately 420° F. should be achieved in order to melt the solder. Since the frame structure 110 has an open region 170 in the center thereof, the vapor/liquid materials which are encountered in a vapor phase oven can readily drain from the surface of chip 28 (FIG. 6), which might not be accomplished if the frame structure 110 were a solid unit entirely covering the chip 28.

In an alternative embodiment, the film portion 12 may be adhered to the printed circuit board 100 using a thin layer of adhesive positioned between the peripheral edges 30 of the film portion 12 and the printed circuit board 100. A preferred adhesive for this purpose would include a cyanoacrylate adhesive known in the art and sold by the Loctite Company of Newington, Connecticut. Adhesives of this type may be chemically formulated to have a curing time of as little as two seconds. However, adhesives with reduced curing times are less resistant to high temperature conditions normally encountered in vapor phase or infrared ovens. For this reason, use of the frame structure 110 as described above is preferred.

Once the outer leads 32 have been soldered in position, the frame structure 110 may be retained in the final product, or removed if desired.

As described herein, the present invention represents an advance in the art of outer lead bonding used in conjunction with integrated circuit packages, especially those incorporating TAB technology. It enables the outer leads of the circuit package to be rapidly and accurately secured in position on the traces of a printed circuit board without the exertion of undue pressure on the leads. Moreover, less solder materials may be used, which reduces the probability of solder bridging between adjacent traces. Finally, use of the invention effectively eliminates problems associated with a lack of outer lead coplanarity. This makes the entire process readily adaptable to large-scale mass production conditions.

Having herein described a preferred embodiment of the invention, it is anticipated that suitable modifications may be made thereto within the skill in the art. Therefore, the invention shall only be construed in accordance with the following claims:

What is claimed is:

1. A soldering interconnect method for attaching the outer leads of a semiconductor package to conductive traces on a printed circuit board comprising the steps of: providing a semiconductor package having a plurality of leads extending outwardly therefrom, each of said leads comprising a first section, a second section connected to said first section and angled upwardly therefrom, and a third section connected to said second section and angled downwardly therefrom, said third section terminating below said lower exterior surface of said semiconductor package, said semiconductor package further comprising an upper exterior surface and a lower exterior surface;

deforming said leads to said semiconductor package so that the ends of said leads extend downwardly below the plane of said lower exterior surface of said semiconductor package at an angle to the surface of the printed circuit board;

providing a printed circuit board having a plurality of electrically conductive traces thereon, each of said traces comprising a portion of solder material applied thereto;

urging said lower exterior surface of said semiconductor package downwardly toward said printed circuit board to spring bias each of said ends of said leads against a trace by moving said ends toward the plane of said lower exterior surface; and heating said printed circuit board sufficiently to solder said ends of said leads to said traces.

2. The method of claim 1 wherein each of said leads extends downwardly below said lower exterior surface of said semiconductor package by a distance equal to or greater than 0.01 inch.

3. The method of claim 1 wherein said first section and said second section form an angle relative to each other of approximately 163-170 degrees, with said third section forming an angle relative to said second section of approximately 85-95 degrees.

4. The method of claim 1 wherein said solder material comprises solder paste applied to said traces.

5. The method of claim 1 wherein said securing of said semiconductor package to said printed circuit board comprises the step of applying an adhesive material between said lower exterior surface of said package and said printed circuit board in order to secure said package in position.

6. The method of claim 1 wherein said leads are independent of each other to enable them to be urged downward independently.

7. A soldering interconnect method for attaching the outer leads of a semiconductor package to conductive traces on a printed circuit board comprising the steps of:

providing a semiconductor package having a plurality of leads extending outwardly therefrom, said semiconductor package comprising a dielectric film having an upper exterior surface, a lower exterior surface, an open section through the film, a metallic conductive pattern formed on said upper exterior surface of said film, and at least one semiconductor device positioned within said open section of said film, said semiconductor device being electrically connected to said metallic conductive pattern on said film;

deforming said leads of said semiconductor package so that the ends of each of said leads extend downwardly below said lower exterior surface of said semiconductor package;

providing a printed circuit board having a plurality of electrically conductive traces thereon, each of said traces comprising a portion of solder material applied thereto;

urging said semiconductor package downwardly against said printed circuit board and securing it thereto, each of said ends of said leads being aligned with at least one of said traces, said urging of said semiconductor package downwardly causing said ends of said leads to be forcefully urged upwardly, thereby biasing said ends against said traces; and heating said printed circuit board in an amount sufficient to melt said solder material so that said ends of said leads may be permanently secured to said traces.

8. The method of claim 7 wherein said flexible portion of dielectric film is comprised of polyimide.

9. The method of claim 7 wherein said securing of said semiconductor package to said printed circuit board comprises the steps of:

providing an engagement member designed for attachment to said printed circuit board with said film therebetween, said engagement member comprising four elongate members secured together to form a rectangular frame structure having an open portion in the center thereof, said frame structure further comprising an upper surface, a lower surface, and a plurality of ribs extending downwardly from said lower surface;

positioning said frame structure on said upper exterior surface of said film with said ribs positioned against said film; and attaching said frame structure to said printed circuit board in order to firmly position said film between said frame structure and said printed circuit board.

10. The method of claim 9 wherein said attaching of said frame structure to said printed circuit board comprises the steps of:

forming a plurality of openings through said circuit board;

providing a plurality of stakes extending downwardly from said lower surface of said frame structure;

aligning said stakes of said frame structure with said openings through said circuit board;

urging said frame structure downward so that said stakes enter said openings with said ribs being positioned against said film; and physically deforming said stakes after entry through said openings in order to prevent the removal of said stakes from said openings.

11. A soldering interconnect method for attaching the outer leads of a semiconductor package to conductive traces on a printed circuit board comprising the steps of:

providing a semiconductor package comprising a flexible portion of dielectric film having an open section therethrough, an upper exterior surface, and a lower exterior surface, said package further comprising a metallic conductive pattern formed on said upper exterior surface, at least one semiconductor device positioned within said open section of said film, said semiconductor device being electrically connected to said metallic conductive pattern on said film, and a plurality of leads in electrical communication with said metallic conductive pattern, said leads extending outwardly from said film;

deforming said leads so that the ends of each of said leads extend downwardly below said lower exterior surface of said film, each of said leads comprising a first section, a second section connected to said first section and angled upwardly therefrom, and a third section connected to said second section and angled downwardly therefrom, said third section terminating below said lower exterior surface of said film;

providing a printed circuit board having a plurality of electrically conductive traces thereon, each of said traces comprising a portion of solder material applied thereto;

urging said film downwardly against said printed circuit board and securing it thereto, each of said ends of said leads being aligned with at least one of said traces, said urging of said film downwardly against said printed circuit board causing said ends of said leads to be forcefully urged upwardly, thereby biasing said ends against said traces, said securing of said film to said printed circuit board comprising the steps of:

providing an engagement member designed for attachment to said printed circuit board with said film therebetween, said engagement member comprising four elongate members secured together to form a rectangular frame structure having an open portion in the center thereof, said frame structure further comprising an upper surface, a lower surface, and a plurality of ribs extending downwardly from said lower surface;

positioning said frame structure on said upper exterior surface of said film with said ribs positioned against said film;

attaching said frame structure to said printed circuit board in order to firmly position said film between said frame structure and said printed circuit board; and heating said printed circuit board in an amount sufficient to melt said solder material so that said ends of said leads may be permanently secured to said traces.

12. The method of claim 11 wherein each of said ends of said leads extends downwardly below said lower exterior surface of said film by a distance equal to or greater than the elastic limit distance of said leads.

13. The method of claim 11 wherein said first section and said second section form an angle relative to each other of approximately 163–170 degrees, with said third section forming an angle relative to said second section of approximately 85–95 degrees.

14. The method of claim 11 wherein said solder material comprises solder paste applied to said traces.

15. The method of claim 11 wherein said attaching of said frame structure to said printed circuit board comprises the steps of:

forming a plurality of openings through said circuit board;

providing a plurality of stakes extending downwardly from said lower surface of said frame structure;

aligning said stakes of said frame structure with said openings through said circuit board;

urging said frame structure downward so that said stakes enter said openings with said ribs being positioned against said film; and physically deforming said stakes after entry through said openings in order to prevent the removal of said stakes from said openings.

16. A soldering interconnect method for attaching the outer leads of a semiconductor package to conductive traces on a printed circuit board comprising the steps of:

providing a semiconductor package comprising a flexible portion of dielectric film having an open section therethrough, an upper exterior surface, and a lower exterior surface, said package further comprising a metallic conductive pattern formed on said upper exterior surface, at least one semiconductor device positioned within said open section of said film, said semiconductor device being electrically connected to said metallic conductive pattern on said film, and a plurality of leads in electrical communication with said metallic conductive pattern, said leads extending outwardly from said film;

deforming said leads so that the ends of each of said leads extend downwardly below said lower exterior surface of said film by a distance equal to or greater than the elastic limit distance of said leads, each of said leads comprising a first section, a second section connected to said first section and angled upwardly therefrom, said first section and said second section forming an angle of about 163-170 degrees relative to each other, and a third section connected to said second section and angled downwardly therefrom, said second section and said third section forming an angle of about 85-95 degrees relative to each other, said third section terminating below said lower exterior surface of said film;

providing a printed circuit board having a plurality of electrically conductive traces thereon and a plurality of openings therethrough, each of said traces comprising a portion of solder material applied thereto;

urging said film downwardly against said printed circuit board and securing it thereto, each of said ends of said leads being aligned with at least one of said traces, said urging of said film downwardly against said printed circuit board causing said ends of said leads to be forcefully urged upwardly, thereby biasing said ends against said traces, said securing of said film to said printed circuit board comprising the steps of:

providing an engagement member designed for attachment to said printed circuit board with said film therebetween, said engagement member comprising four elongate members secured together to form a rectangular frame structure having an open portion in the center thereof, said frame structure further comprising an upper surface, a lower surface, a plurality of stakes extending downwardly from said lower surface, and a plurality of ribs extending downwardly from said lower surface;

aligning said stakes of said frame structure with said openings through said printed circuit board;

urging said frame structure downward so that said stakes enter said openings with said ribs being positioned against said film; and physically deforming said stakes after entry through said openings in order to prevent the removal of said stakes from said openings; and heating said printed circuit board in an amount sufficient to melt said solder material so that said ends of said leads may be permanently secured to said traces.

17. A soldering interconnect method for attaching the outer leads of a semiconductor package to conductive traces on a printed circuit board comprising the steps of:

providing a semiconductor package having a plurality of leads extending outwardly therefrom, said semiconductor package further comprising an upper exterior surface and a lower exterior surface;

deforming said leads of said semiconductor package so that the ends of said leads extend downwardly below the plane of said lower exterior surface of said semiconductor package at an angle to the surface of the printed circuit board;

providing a printed circuit board having a plurality of electrically conductive traces thereon, each of said traces comprising a portion of solder material applied thereto;

urging said lower exterior surface of said semiconductor package downwardly toward said printed circuit board to spring bias each of said ends of said leads against a trace by moving said ends above the plane of said lower exterior surface; and heating said printed circuit board sufficiently to solder said ends of said leads to said traces.

* * * * *